US008678284B2

(12) United States Patent
Scheuer

(10) Patent No.: US 8,678,284 B2
(45) Date of Patent: Mar. 25, 2014

(54) SYSTEM AND A METHOD FOR NANO IMPRINTING

(75) Inventor: Jacob Scheuer, Tel-Aviv (IL)

(73) Assignee: Ramot at Tel-Aviv University Ltd., Tel-Aviv (IL)

( * ) Notice: Subject to any disclaimer, the term of this patent is extended or adjusted under 35 U.S.C. 154(b) by 0 days.

(21) Appl. No.: 13/320,930

(22) PCT Filed: Sep. 16, 2009

(86) PCT No.: PCT/IL2009/000906
§ 371 (c)(1),
(2), (4) Date: Nov. 17, 2011

(87) PCT Pub. No.: WO2010/032243
PCT Pub. Date: Mar. 25, 2010

(65) Prior Publication Data
US 2012/0061471 A1 Mar. 15, 2012

Related U.S. Application Data

(60) Provisional application No. 61/097,237, filed on Sep. 16, 2008.

(51) Int. Cl.
*G06K 7/10* (2006.01)

(52) U.S. Cl.
USPC .......................................... 235/454; 430/325

(58) Field of Classification Search
USPC ............................... 235/454; 430/325, 326, 5
See application file for complete search history.

(56) References Cited

U.S. PATENT DOCUMENTS

| 6,860,956 | B2 * | 3/2005 | Bao et al. ....................... 156/232 |
| 7,632,417 | B2 * | 12/2009 | Suh et al. ........................... 216/2 |
| 2002/0115002 | A1 | 8/2002 | Bailey et al. |
| 2004/0175631 | A1 * | 9/2004 | Crocker et al. ................... 430/5 |
| 2004/0247874 | A1 | 12/2004 | Ryzi et al. |
| 2006/0196945 | A1 | 9/2006 | Mendels |
| 2007/0264481 | A1 | 11/2007 | DeSimone et al. |
| 2007/0283883 | A1 * | 12/2007 | Dakshina-Murthy et al. .. 118/75 |
| 2012/0282554 | A1 * | 11/2012 | Kobrin et al. ................. 430/326 |

FOREIGN PATENT DOCUMENTS

WO   WO 2010/032243   3/2010

OTHER PUBLICATIONS

International Preliminary Report on Patentability Dated Mar. 22, 2011 From the International Bureau of WIPO Re. Application No. PCT/IL2009/000906.
International Search Report and the Written Opinion Dated Jan. 27, 2010 From the International Searching Authority Re. Application No. PCT/IL2009/000906.

* cited by examiner

*Primary Examiner* — Ahshik Kim

(57) ABSTRACT

A method for creating a highly accurate nanostructure is provided, the method includes: (i) creating a highly accurate nanostructure prototype, wherein the highly accurate nanostructure prototype, when illuminated with a predefined illumination, provides a unique optical pattern; (ii) creating at least one highly accurate nanostructure mold from the highly accurate nanostructure prototype, wherein each highly accurate nanostructure mold enables a creation of a highly accurate nanostructure that is substantially similar to the highly accurate nanostructure prototype and which, when illuminated with the predefined illumination, provides the unique optical pattern; and (iii) molding the highly accurate nanostructure using the highly accurate nanostructure mold, wherein the highly accurate nanostructure, when illuminated with the predefined illumination, provides the unique optical pattern.

23 Claims, 6 Drawing Sheets
(5 of 6 Drawing Sheet(s) Filed in Color)

SYSTEM AND A METHOD FOR NANO IMPRINTING

CROSS REFERENCE TO RELATED APPLICATIONS

CROSS REFERENCE TO RELATED APPLICATIONS RELATED APPLICATIONS

This application is a National Phase of PCT Patent Application No. PCT/IL2009/000906 having International filing date of Sep. 16, 2009, which claims the benefit of priority of U.S. Provisional Patent Application No. 61/097,237 filed on Sep. 16, 2008. The contents of the above applications are all incorporated herein by reference.

FIELD OF INVENTION

This invention relates to a highly secure and difficult to forge authentication elements and more particularly to elements comprising nanometer scale imprinted feature.

BACKGROUND OF THE INVENTION

Brand, documents and smart cards authentication and security are important applications in today's information Era. Tagging brand product to prevent forging and copying, marking money bills, credit cards, Passports and ID cards are all examples for the need for sophisticated security and authentication measures that are difficult to imitate or forge. Watermarks, holograms, special materials and marks are all examples for such measures, currently employed in bills, credit cards and ID documents.

The primary requirements for such measures are that it would be extremely difficult to copy or forge them and that their realization is relatively inexpensive. As can be expected both demands are, to some extent, contradictory.

Currently available solutions are based on RFID chips, visible/invisible micro-printed patterns and holograms. These solutions suffers from several inherent drawbacks such as partial security, high cost, large dimensions (in particular RFID and holograms), privacy issues (RFID), and lack of flexibility.

G. Antes (U.S. Pat. No. 5,101,184) proposed using multiple diffraction elements consisting of sets of surface gratings and an appropriate apparatus for authentication. This invention, however, is limited to passive diffraction elements which can be analyzed and counterfeited using relatively simple and inexpensive apparatus.

SUMMARY OF THE INVENTION

A method for creating a highly accurate nanostructure is provided, the method includes: (i) creating a highly accurate nanostructure prototype, wherein the highly accurate nanostructure prototype, when illuminated with a predefined illumination, provides a unique optical pattern; (ii) creating at least one highly accurate nanostructure mold from the highly accurate nanostructure prototype, wherein each highly accurate nanostructure mold enables a creation of a highly accurate nanostructure that is substantially similar to the highly accurate nanostructure prototype and which, when illuminated with the predefined illumination, provides the unique optical pattern; and (iii) molding the highly accurate nanostructure using the highly accurate nanostructure mold, wherein the highly accurate nanostructure, when illuminated with the predefined illumination, provides the unique optical pattern.

The method further includes authentication by illuminating the highly accurate nanostructure with the predefined illumination, to receive a received optical pattern, and determining authenticity of the highly accurate nanostructure, in response to at least one result of a comparison between the received optical pattern and the unique optical pattern.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
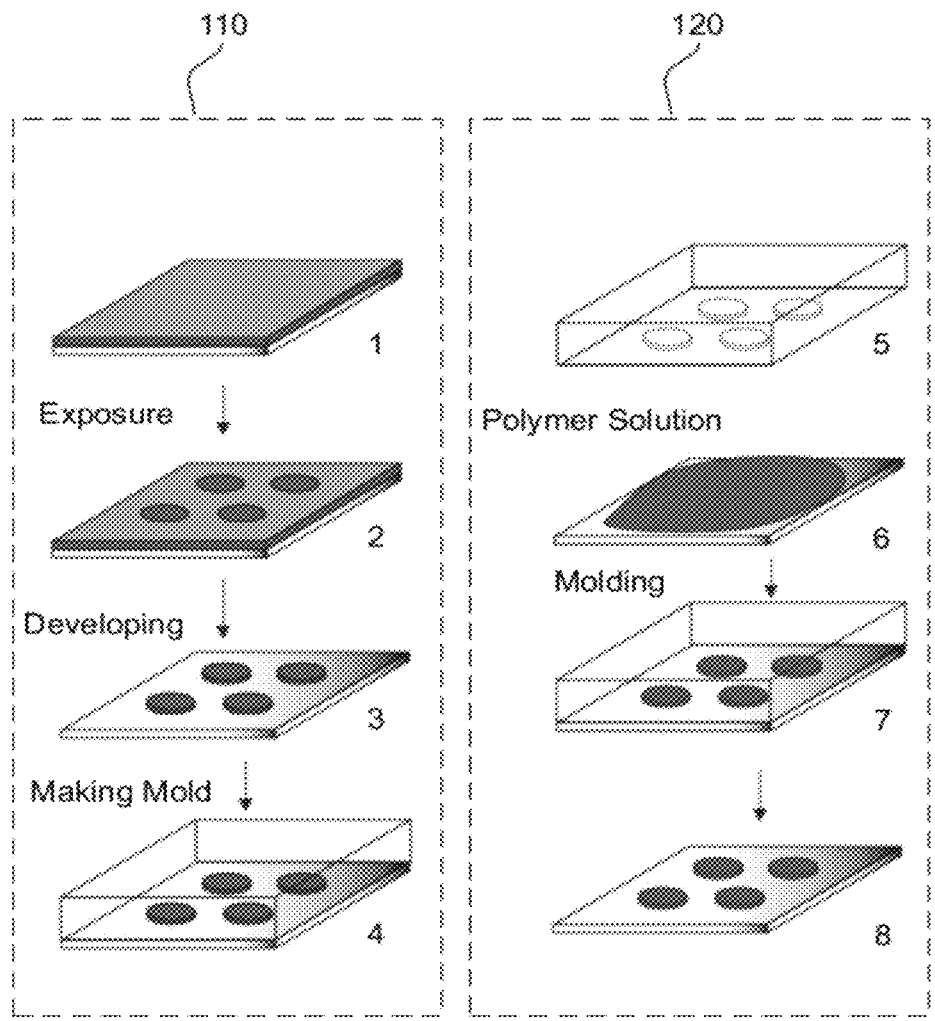
FIG. 1 illustrates a dual phase replica molding technique, according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A dual phase Nano Imprinting method and system is provided and can be based on polymeric replication technique. The method and system can provide both high security (high resilience to counterfeiting) and low cost suitable for mass deployment, simultaneously. A product/card/document etc. is imprinted with a set of extremely small (nanometer scale) patterns which are, of course invisible but can be "read" and analyzed using appropriate apparatus. Such patterns can be unique to a product of even to a specific item (like a serial number).

FIG. 1 illustrates a dual phase replica molding technique, according to an embodiment of the invention. The process consists of two phases: In a first phase 110, a template or master device (also referred to as nanostructure prototype, and as highly accurate nanostructure prototype) having the desired pattern and geometry is realized. Conveniently, the nanostructure prototype, when illuminated with a predefined illumination, provides a unique optical pattern.

It should be noted that the predefined illumination may be of different kinds and may belong to different portions of the electromagnetic spectrum. From example, some embodiments of the invention may utilize a predefined illumination from the portion of the spectrum between the regions known as far infrared and ultraviolet, while other embodiments may utilize other portions of the spectrum (which may partly overlap the latter or be distinct from it, and may also be divided to different regions of the spectrum).

The predefining of the illumination is used to make sure that a similar illumination is used in different times in the process.

The unique pattern is unique at least in that that it is distinguishable from other pattern which may be outputted from similar nanostructures. For example, it may have distinguishable wavelengths that are present or missing, distinguishable patterns and so forth. The unique pattern may also include coded information which conveys meaning other than identifiability of the pattern.

It is noted that the pattern can be designed by the customer and can be practically arbitrary. In addition, it can be realized using a wide variety of fabrication methods (Lithography, focused ion beam (FIB), etc.). According to various embodiments of the invention, the pattern used is designed to be easily authenticated (e.g. exhibit a specific diffraction pattern, etc.).

It is noted that the nanostructure prototype is conveniently a highly accurate nanostructure prototype, having an accuracy of few nanometers, wherein the accuracy may define the size of the smallest features of a pattern implemented in the nanostructure prototype, the smallest distance between distinct features, and so forth. It is also noted that while nanometer scale accuracy may be implemented, other accuracies may be implemented in other embodiments of the invention, which may be substantially different from this scale.

The creating may include stage of exposing light-sensitive material to light (e.g. from state 1 to state 2 in the diagram), and a stage of developing the material exposed to light, to provide the nanostructure prototype (e.g. from state 2 to state 3 in the diagram).

From the nanostructure prototype, one or more nanostructure molds are created, wherein each nanostructure mold enables a creation of a nanostructure that is substantially similar to the nanostructure prototype and which, when illuminated with the predefined illumination, provides the unique optical pattern. It is noted that the one or more nanostructure molds as well as the created nanostructures may conveniently be of similar accuracy (e.g. very high accuracy) to that of the nanostructure prototype. The nanostructure molds may also be referred to as highly accurate nanostructure molds, and the created nanostructure may also be referred to as highly accurate nanostructure.

For example, according to an embodiment of the invention, a Polydimethylsiloxane (PDMS) mold of this pattern may be created. Note that each master can be used to realize many molds. The making of the mold may correspond to the illustrated stage "Making Mold" in the diagram, that leads to state 4. It is also noted that in other embodiments of the invention, materials other than PDMS may be used for the creation of the molds, such as silicon, silicon dioxide, polysiloxane, and so forth. One reason for which PDMS may be preferred over the aforementioned materials is its flexibility.

In a second phase 120, the mold is used to imprint the designed pattern on the product or item which we want to authenticate (e.g. including using the mold illustrated in state 5 to mold a polymer solution illustrated in state 6, to mold the polymer solution—as illustrated in state 7—for the receiving of nanostructure that is illustrated in state 8).

It should be emphasized that in order to achieve high security of authentication and resilience to counterfeiting, it is desired that the fabricated pattern would possess extremely small features and complex pattern which realization necessitates access to sophisticated fabrication technologies and knowledge (e.g. E-beam lithography, FIB, etc.). The security is achieved by the fact that in order to copy the pattern, the forger must have access to extremely sophisticated and expensive analysis and fabrication tools and, in addition, invest much time in developing the actual process, materials etc. The dual-phase scheme, however, ensures that only a single (expensive) master is needed in order to tag a complete line of products where the actual tagging is simple and inexpensive as it used a low cost mold that is manufactured by using the master.

According to different embodiments of the invention, the following features may be implemented for the authentication:

1. Incorporation of multiple security levels authentication and schemes in a single pattern;
2. Employment of non-propagating (i.e. near-field pattern) fields for ultra-secure authentication;
3. Straight-forwards incorporation of a wide range of materials. In particular, florescent and lasing materials;
4. Realization of 3D patterns for high security level of authentication;
5. Authentication using an optical data processing element imprinted on the object;
6. Personalization—ability to imprint unique pattern or a sequence of patterns on each item (similar to a "serial number"); and
7. Employment of diverse authentication methods and technologies.

Figure 2:
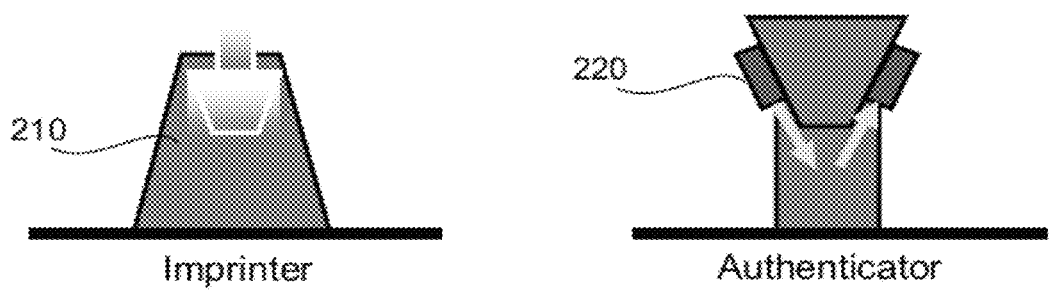
FIG. 2 illustrates a authentication concept according to an embodiment of the invention.

FIG. 2 illustrates an authentication process concept, according to an embodiment of the invention. During the production flow, the item is imprinted, using an imprinter 210, with a unique pattern. For authentication, an authenticator 220 "reads" the imprinted pattern and verifies the authenticity of the item.

The proposed method conveniently facilitates the imprinting of extremely small features using a wide variety of materials. To date, features as small as 20 nm can be realized using Nano Imprinting Lithography (NIL). The imprinted materials could be all types of soluble polymers, sol-gels, metallic layers and thermo-plastic materials, as well as biological materials and more.

The authentication technology implemented is conveniently chosen according to the desired level of security. Fast, moderate-level screening schemes could employ, for example, identification of optical diffraction patterns from the imprinted structure. According to an embodiment of the invention, the imprinted structure could comprise sub-wavelength features which can be detected with more sophisticated authentication schemes (comparing, for example, to prior art holograms), thus providing an inherently higher security level when needed. Such imaging technologies, providing sub-wavelength resolution capability, are for example Near-field scanning optical microscopy (NSOM), atomic force microscopy (AFM), scanning electron microscopy (SEM), Transmission electron microscopy (TEM), etc.

Figure 3:
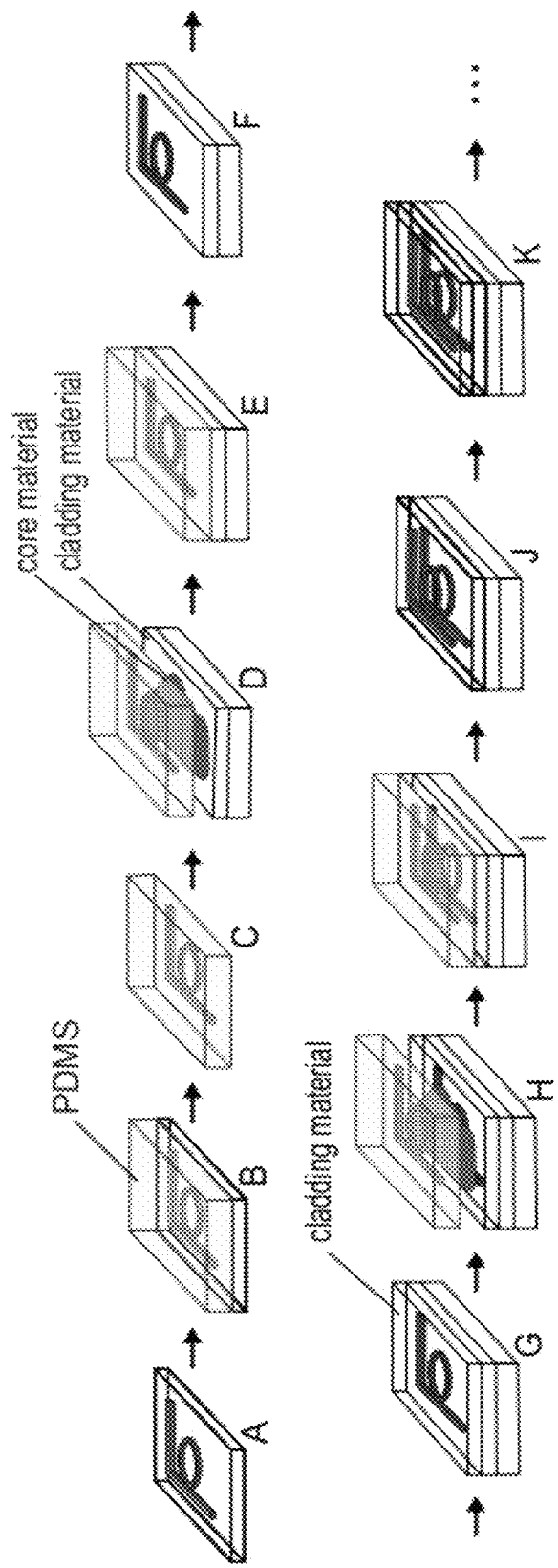
FIG. 3 illustrates a 3D patterning using Nano Imprinting Lithography (NIL) according to an embodiment of the invention.
Figure 4:
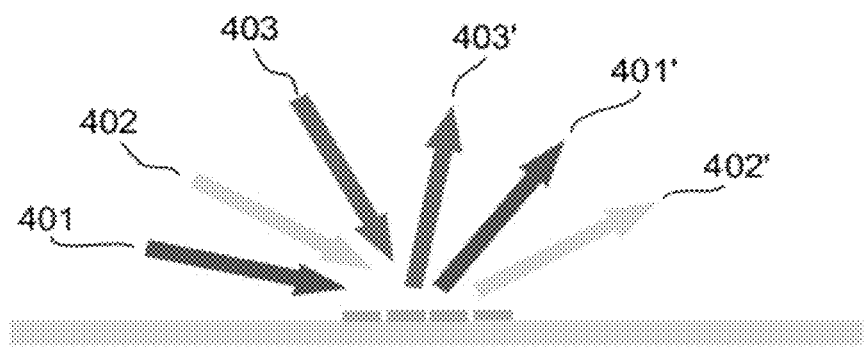
FIG. 4 illustrates a multi-level encoding scheme, according to an embodiment of the invention.
Figure 5:
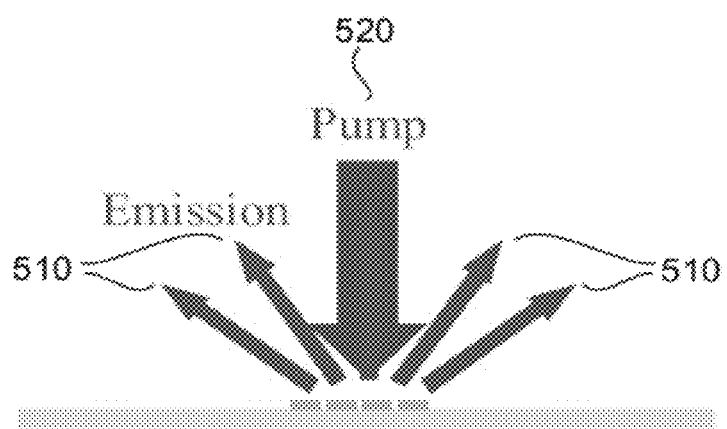
FIG. 5 illustrates an authentication incorporating optical gain and florescent materials according to an embodiment of the invention.

In addition to sub wavelength resolution, the proposed method facilitates the realization of nanometer-scale structures consisting of diverse materials. This property paves the way to enhanced security and authentication level by incorporating several authentication concepts simultaneously. Such "multi-level" authentication schemes could be, according to different embodiments of the invention:

1. 3D patterns. The imprinting process can be repeated thus allowing the realization of more complex 3D structures (e.g. as illustrated in FIG. 3).
2. Multi-level encoding—multiple wavelengths, angles, illumination patterns, etc. (e.g. as illustrated in FIG. 4 that illustrates three different wavelength beams or illumination patterns 401, 402 and 403 and their corresponding reflected beams/patterns 401', 402' and 403').
3. Light emitting materials—dyes, polyfluorenes, etc. Such scheme will react by emitting a pattern 510 at a predefined wavelength when illuminated properly (e.g. by a pump 520, as illustrated at FIG. 5).
4. Data fusion—combining information from multiple authentication technologies.
5. On-card optical signal processing. Using NIL it is possible to realize an optical processing element on the card or object. The authentication procedure could include, for example, the injection of an optical signal at an input port 601 of an optical signal processor 620 and reading a reflected signal from an output port 602 using fiber optic (see FIG. 6).

Figure 7:
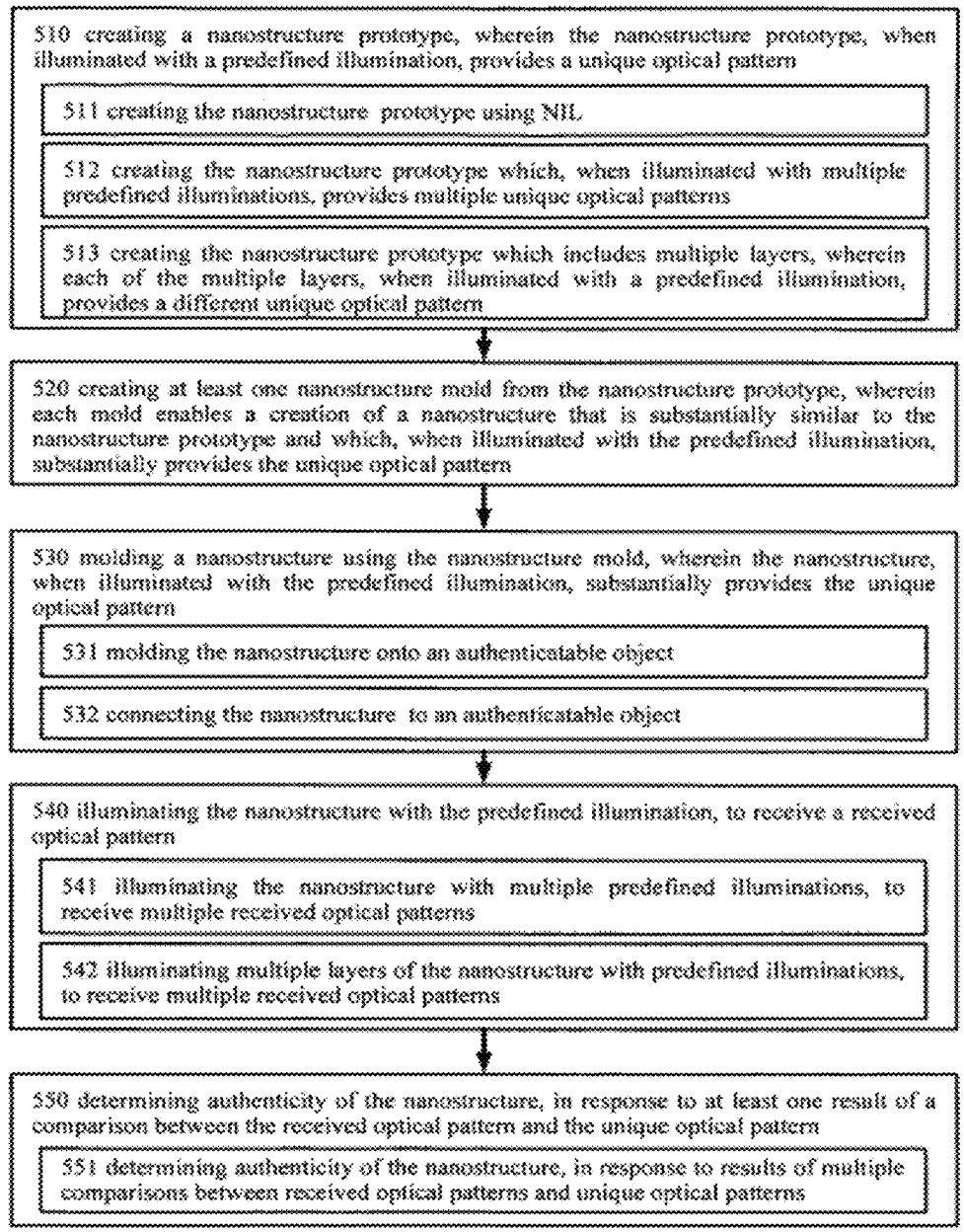
FIG. 7 illustrates a flow diagram of a method for creating a highly accurate nanostructure, according to an embodiment of the invention.

FIG. 7 illustrates method 500 for creating a nanostructure, according to an embodiment of the invention. Method 500 starts with stage 510 of creating a nanostructure prototype (which may also be referred to as highly accurate nanostructure prototype), wherein the nanostructure prototype, when illuminated with a predefined illumination, provides a unique optical pattern. It is noted that the predefined illumination may be characterized in different ways, many of which are known in the art. A process for creating the nanostructure prototype is exemplified, for example, in states 1 through 3 of FIG. 1.

The nanostructure prototype, also referred to as a template or master device, is created with a desired geometry, usually within the nano-level scale. It is noted that the creation of the nanostructure prototype is relatively complex and expensive, in order to enable the providing of the unique optical pattern, that is distinguishable from other optical patterns of counterfeits, for example. More specifically, it would be advantageous to design a pattern which can be authenticated easily (e.g. exhibit a specific diffraction pattern, etc.). It is further noted that while the predefined illumination may also be kept secret, as an additional layer of security, the physical (and especially optical) characteristics of the nanostructure prototype are extremely hard to imitate without access to the nanostructure prototype or to molds thereof.

A wide variety of fabrication methods (e.g. Lithography, FIB, etc.) may be utilized for the creation of the nanostructure prototype. It should be emphasized that in order to achieve high security of authentication and resilience to counterfeiting, it is desired that the fabricated pattern would possess extremely small feature and complex pattern which realization necessitates access to sophisticated fabrication technologies and knowledge (e.g. electron-beam lithography, focused ion beam (FIB), etc.). The security is achieved by the fact that in order to copy the pattern, the forger must have access to extremely sophisticated and expensive analysis and fabrication tools and, in addition, invest much time in developing the actual process, materials etc. Conveniently, only a single (expensive) optical data processing element prototype is needed in order to create multiple optical data processing elements (e.g. for tagging a complete line of products where the actual tagging is simple and inexpensive).

The authentication technology (and therefore also the technology used for the creating of stage 510) should be chosen according to the desired level of security. Fast, moderate-level screening schemes could employ, for example, identification of optical diffraction patterns from the imprinted structure. The authentication level of such scheme is similar to that provided by holograms, however, with one substantial advantage: The imprinted structure could comprise sub-wavelength features which can be detected with more sophisticated authentication schemes, thus providing an inherently higher security level when needed. Imaging technologies that provide sub-wavelength resolution capability and which may be implemented for the creation of the nanostructure prototype (and possibly of the multiple optical data processing elements), are, for example, Near Field Scanning Optical Microscopy (NSOM), atomic force microscopy (AFM), scanning electron microscopy (SEM), Transmission electron microscopy (TEM), etc.

According to an embodiment of the invention, stage 510 includes stage 511 of creating the nanostructure prototype using Nano-Imprint lithography (NIL). It is noted that any of the aforementioned technologies may be used, as well as other technologies.

According to an embodiment of the invention, stage 510 includes stage 512 of creating the nanostructure prototype which, when illuminated with multiple predefined illuminations, provides multiple unique optical patterns. This can be done in many ways (usually required more complex a planning process), and possibly also using multiple layers, as explained in relation to stage 513 and elsewhere in the application.

According to an embodiment of the invention, stage 510 includes stage 513 of creating the nanostructure prototype which includes multiple layers, wherein each of the multiple layers, when illuminated with a predefined illumination, provides a different unique optical pattern.

In addition to sub wavelength resolution, the proposed method facilitates the realization of nanometer-scale structures in the created nanostructure (which may also be referred to as highly accurate nanostructure), structures that include diverse materials. This property paves the way to enhanced security and authentication level by incorporating several authentication concepts simultaneously. Such "multi-level" authentication schemes could be:

1. 3D patterns. The imprinting process can be repeated thus allowing the realization of more complex 3D structures (as exemplified, for example, in FIG. 3).
2. Multi-level encoding—multiple wavelengths, angles, predefined illumination patterns, etc. (as exemplified, for example, in FIG. 4, in which every colored arrow represents a different predefined illumination).
3. Light emitting materials—dyes, polyfluorenes, etc. Such scheme will react by emitting a pattern at a predefined wavelength when illuminated properly (as exemplified, for example, in FIG. 5).
4. Data fusion—combining information from multiple authentication technologies.
5. On-card optical data processing. Using NIL it is possible to realize an optical processing element on the card or object. The authentication procedure could include, for example, the injection of an optical signal at the input port of the processor and reading it from the output port using fiber optic (as exemplified, for example, in FIG. 6).

Stage 510 is followed by stage 520 of creating at least one optical data processing element mold from the nanostructure prototype, wherein each mold enables a creation of a nanostructure that is substantially similar to the nanostructure prototype and which, when illuminated with the predefined illumination, substantially provides the unique optical pattern.

It is noted that, according to an embodiment of the invention, the nanostructure mold is a Polydimethylsiloxane (PDMS) mold, and that each optical data processing element prototype can conveniently be used to realize many molds. Each optical data processing element mold is conveniently used to imprint the designed pattern (e.g. on the product or item which we want to authenticate) as an optical data processing element.

Stage 520 is followed by stage 530 of molding a highly accurate nanostructure using a nanostructure mold (of the at least one molds of stage 520, e.g. a highly accurate nanostructure mold), wherein the nanostructure, when illuminated with the predefined illumination, substantially provides the unique optical pattern. It is noted that stage 530 may include stage 531 of molding the nanostructure onto an authenticatable object. Stage 530 may include stage 532 of connecting the nanostructure to an authenticatable object. That is, if the nanostructure is indeed used for authentication of an authenticatable object (e.g. consumer goods, luxury items, original documents, original bank notes, and so forth), it may be molded directly onto the authenticatable object, or to be molded separately, and than to be connected to the authenticatable object.

The key feature and greatest advantage of the proposed method is the ability to imprint extremely small features using a wide variety of materials. To date, features as small as 20 nm can be realized using NIL. The imprinted materials could be, for example, all types of soluble polymers, sol-gels, metallic layers and thermo-plastic materials, as well as biological materials and more.

All the stages of method 500 until now referred to the creation of the nanostructure, which may be used for authentication. It is noted that the stages need not necessarily be carried out instantly one after the other, and that several instances of stages 520 and/or stage 530 may be carried out for the creating of multiple substantially similar optical data processing elements (e.g. new molds may be created after older optical data processing element molds worn out, and so forth). Neither does the different aforementioned stages of method 500 should necessarily be carried out be the same machine or in the same location.

The following stages of method 500, which are carried out according to an embodiment of the invention, refer to the using of the nanostructure for authenticating. It is noted that those stages are not necessarily carried out for each optical data processing element created using according to method 500 (for example, if the nanostructures are used for authentication of bank notes, not all the banknotes, and not necessarily any bank note of any given group of bank notes that carry substantially identical optical data processing elements, may be subject to such authentication). It is further noted that optical data processing elements created according to the former stages of method 500 may be used for other purposed except of authentication. Such uses may include, by way of example only, and not intending to limit the scope of the invention in any way, coding of different objects or batches thereof, indication of manufacturing facility and so forth.

According to an embodiment of the invention, method 500 continues with stage 540 of illuminating the nanostructure with the predefined illumination, to receive a received optical pattern. It is noted that, according to an embodiment of the invention, stage 540 may include stage 541 of illuminating the nanostructure with multiple predefined illuminations, to receive multiple received optical patterns, and that, according to an embodiment of the invention, stage 540 may include stage 542 of illuminating multiple layers of the nanostructure with predefined illuminations, to receive multiple received optical patterns.

The received optical pattern (or patterns) may be than compared to one or more unique optical patterns that are associated with one or more optical data processing element prototypes (e.g. a series of luxury watches may be tagged using any one of four optical data processing elements), to determine if the optical patterns (received and expected "unique" patterns) are similar. It is noted that the comparing may be of the entire received optical pattern (or portion of which), or of one or more derived characteristic of the received optical pattern, which may be compared to one or more derived characteristic of the unique optical pattern (or patterns).

Stage 540 is followed, according to such an embodiment of the invention, by stage 550 of determining authenticity of the nanostructure (and thus usually of the authenticatable object), in response to at least one result of a comparison between the received optical pattern and the unique optical pattern.

According to an embodiment of the invention, stage 550 includes stage 551 of determining authenticity of the nanostructure, in response to results of multiple comparisons between the received optical patterns and at least one unique optical patterns.

Figure 6:
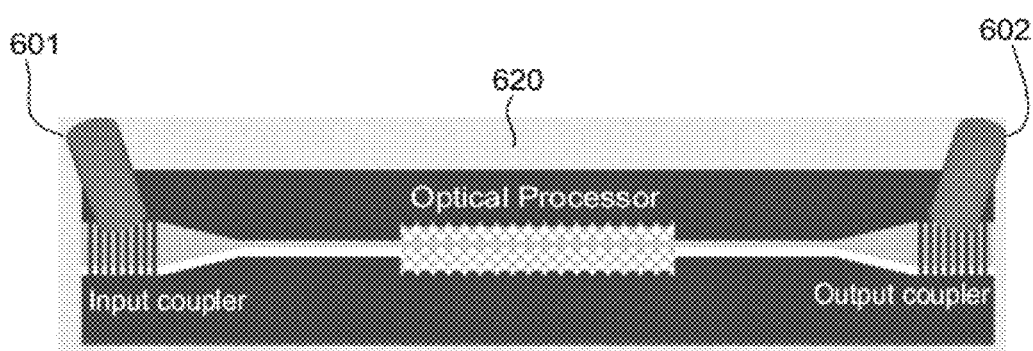
FIG. 6 illustrates an on-card optical signal processor according to an embodiment of the invention.

Referring now to FIG. 6, it is noted that, according to an embodiment of the invention, the nanostructure is an optical data processing element, wherein method 500 further includes connecting the optical data processing element to an input terminal and to an output terminal, wherein the optical data processing element, when illuminated by predefined illumination that is channeled via the input terminal, provides the unique optical pattern via the output terminal. That is, the nanostructure that is created according to method 500 is an optical data processing element that is incorporated to an authenticable object (e.g. a card), wherein the optical data processing element may be connected to two optical interfaces; one for receiving the predefined illumination, and the other to project an optical pattern, which may be compared by an external comparer system, that is adapted to receive optical information from the output terminal, to the unique optical pattern.

The present invention can be practiced by employing conventional tools, methodology and components. Accordingly, the details of such tools, component and methodology are not set forth herein in detail. In the previous descriptions, numerous specific details are set forth, in order to provide a thorough understanding of the present invention. However, it should be recognized that the present invention might be practiced without resorting to the details specifically set forth.

A method for authentication is also disclosed, the method including the following stages: (a) illuminating a nanostructure with predefined illumination, wherein the nanostructure is molded from a nanostructure mold that have been created from a nanostructure prototype which, when illuminated with a predefined illumination, provides a unique optical pattern; (b) detecting a pattern that results from the illumination of the nanostructure; and (c) selectively determining whether the nanostructure is authentic, in response to a result of a comparison of the detected pattern and the unique optical pattern. It is noted that various embodiments of the method for authentication may have different varieties and stages, to incorporate different varieties—mutatis mutandis—of the manufacturing methods and of the nanostructures themselves, e.g. as discussed above.

A nanostructure mold is also disclosed, the nanostructure mold having multiple nanometric features, wherein the nanostructure mold is created from a nanostructure prototype that, when illuminated with a predefined illumination, provides a unique optical pattern; wherein the nanostructure mold enables molding of a nanostructure that is substantially similar to the nanostructure prototype and which, when illuminated with the predefined illumination, provides the unique optical pattern. It is noted that various embodiments of the nanostructure mold may have different varieties, to incorporate different varieties—mutatis mutandis—of the manufacturing methods and of the nanostructures themselves, e.g. as discussed above.

A nanostructure is also disclosed, the nanostructure having multiple nanometric features, wherein optical characteristic of the nanostructure result in the provision of a unique optical pattern when the nanostructure is illuminated with predefined illumination, wherein the nanostructure is molded from a nanostructure mold that was created from a nanostructure prototype which, when illuminated with the predefined illumination, provides the unique optical pattern. It is noted that various embodiments of the nanostructure may have different varieties, to incorporate different varieties—mutatis mutandis—of the manufacturing methods and of the nanostructures themselves, e.g. as discussed above.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method for creating a plurality of nanostructure molds, the method comprising:
   creating a nanostructure prototype, wherein the nanostructure prototype, when illuminated with a predefined illumination, provides a unique optical pattern; and
   creating a plurality of nanostructure mold replicas from the same nanostructure prototype, wherein each nanostructure mold replica enables a creation of a nanostructure that is substantially similar to the same nanostructure prototype and which, when illuminated with the predefined illumination, provides the same unique optical pattern.

2. The method of claim 1, wherein the nanostructure is an optical signal processing element, wherein the method further comprising connecting the optical signal processing element to an input terminal and to an output terminal; wherein the optical signal processing element, when illuminated by the predefined illumination that is channeled via the input terminal, provides the unique optical pattern via the output terminal.

3. The method of claim 1, wherein the unique optical pattern is a specific diffraction pattern.

4. The method of claim 1, further comprising creating the nanostructure prototype using nanoimprinting lithography.

5. The method of claim 1, wherein the creating of the nanostructure prototype comprises creating the nanostructure prototype which, when illuminated with multiple predefined illuminations, provides multiple unique optical patterns.

6. The method of claim 1, wherein the creating of the nanostructure prototype comprises creating the nanostructure prototype which includes multiple layers, wherein each of the multiple layers, when illuminated with a predefined illumination, provides a different unique optical pattern.

7. The method of claim 1, wherein the nanostructure prototype is at least partly made of a light emitting material.

8. The method of claim 1, wherein the at least one nanostructure mold is made of a polymeric material.

9. The method of claim 8, wherein the polymeric material is polysiloxane.

10. The method of claim 8, wherein the polymeric material is Polydimehylsiloxane (PDMS).

11. The method of claim 1, further comprising molding an authenticable nanostructure using one of said nanostructure molds, wherein the authenticable nanostructure, when illuminated with the predefined illumination, provides the unique optical pattern.

12. The method of claim 11, wherein the molding comprises molding the authenticable nanostructure onto an authenticable object.

13. The method of claim 11, wherein the molding comprises connecting the authenticable nanostructure to an authenticable object.

14. The method of claim 11, further comprising illuminating the authenticable nanostructure with the predefined illumination, to receive an optical pattern, and determining authenticity of the authenticable nanostructure, in response to at least one result of a comparison between the received optical pattern and the unique optical pattern.

15. The method of claim 14, wherein the illuminating comprises illuminating the authenticable nanostructure with multiple predefined illuminations, to receive multiple received optical patterns.

16. The method of claim 14, wherein the illumination comprises illuminating multiple layers of the authenticable nanostructure with predefined illuminations, to receive multiple received optical patterns.

17. The method of claim 14, wherein the determining comprises determining authenticity of the authenticable nanostructure, in response to results of multiple comparisons between received optical patterns and at least one unique optical pattern.

18. The method of claim 12, further comprising comparing, prior to the determining, at least one received optical pattern to at least one unique optical patterns that is associated with at least one authenticable nanostructure prototype.

19. The method of claim 16, wherein the comparing comprises comparing at least one derived characteristic of the received optical pattern to at least one derived characteristic of the at least one unique optical pattern.

20. A method for authentication, the method comprising:
   illuminating a nanostructure with predefined illumination;
   detecting a pattern that results from the illumination of the nanostructure;
   obtaining a unique optical pattern being characteristic of a nanostructure prototype;
   comparing said detected pattern to said unique optical pattern; and selectively determining whether the nanostructure was prepared from said nanostructure prototype, in response to said comparison.

21. A collection of nanostructure mold replicas, each nanostructure mold replica having multiple nanometric features characterized by accuracy of a few nanometers.
- wherein all nanostructure molds are created from a single nanostructure prototype that, when illuminated with a predefined illumination, provides a unique optical pattern; and
- wherein each nanostructure mold enables molding of an authenticable nanostructure that is substantially similar to the nanostructure prototype and which, when illuminated with the predefined illumination, provides the unique optical pattern of the nanostructure prototype.

22. A method of fabrication an authenticable nanostructure, the method comprising:
- providing a nanostructure mold replica having multiple nanometric features characterized by accuracy of a few nanometers and being created from a nanostructure prototype which, when illuminated with the predefined illumination, provides a unique optical pattern, and
- molding an authenticable nanostructure using one of said nanostructure molds;
- wherein optical characteristic of the authenticable nanostructure result in the provision of said unique optical pattern when the authenticable nanostructure is illuminated with said predefined illumination.

23. An authenticable nanostructure, producible by the method of claim 22.

* * * * *